(12) United States Patent
Punsalan et al.

(10) Patent No.: US 7,575,979 B2
(45) Date of Patent: Aug. 18, 2009

(54) METHOD TO FORM A FILM

(75) Inventors: David Punsalan, Eugene, OR (US); Peter Mardilovich, Corvallis, OR (US); Randy Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 178 days.

(21) Appl. No.: 10/875,034

(22) Filed: Jun. 22, 2004

(65) Prior Publication Data

US 2005/0279986 A1 Dec. 22, 2005

(51) Int. Cl.
*H01L 21/336* (2006.01)
*H01L 21/331* (2006.01)

(52) U.S. Cl. ............... 438/308; 438/378; 257/E21.4; 257/E21.297; 427/343; 427/567

(58) Field of Classification Search ............... 438/154, 438/493, 497, 500, 308, 378; 977/773; 427/343, 427/344, 567, 578, 398.3
See application file for complete search history.

(56) References Cited

U.S. PATENT DOCUMENTS

| | | | |
|---|---|---|---|
| 5,219,611 A * | 6/1993 | Giannelis et al. ............ 427/162 |
| 5,478,867 A * | 12/1995 | Tabor ......................... 521/163 |
| 6,146,716 A | 11/2000 | Narang |
| 6,348,295 B1 | 2/2002 | Griffith et al. |
| 6,362,348 B1 * | 3/2002 | Takahashi et al. ........... 549/315 |
| 6,487,774 B1 | 12/2002 | Nakao et al. |
| 6,491,969 B2 | 12/2002 | Eldridge |
| 6,503,831 B2 | 1/2003 | Speakman |
| 6,548,122 B1 | 4/2003 | Sharma et al. |
| 6,596,406 B2 | 7/2003 | Ikeda et al. |
| 6,787,804 B1 * | 9/2004 | Yang .......................... 257/62 |
| 6,841,006 B2 * | 1/2005 | Barnes et al. ............... 118/719 |
| 7,022,182 B1 * | 4/2006 | Yoshida et al. ............... 117/84 |
| 7,169,327 B2 * | 1/2007 | Ito et al. .................... 252/500 |
| 7,176,245 B2 * | 2/2007 | Stucky et al. ............... 516/111 |
| 2002/0090565 A1 | 7/2002 | Griffith et al. |
| 2002/0105080 A1 | 8/2002 | Speakman |
| 2003/0059984 A1 | 3/2003 | Sirringhaus et al. |
| 2003/0132498 A1 | 7/2003 | Uematsu et al. |
| 2003/0153141 A1 | 8/2003 | Carter et al. |
| 2003/0181537 A1 * | 9/2003 | Kirchmeyer et al. ......... 521/50 |
| 2003/0185971 A1 | 10/2003 | Saksa et al. |
| 2003/0203101 A1 | 10/2003 | Haubrich et al. |
| 2003/0213614 A1 | 11/2003 | Furusawa et al. |
| 2004/0009304 A1 | 1/2004 | Pichler et al. |
| 2004/0023432 A1 | 2/2004 | Haga |

(Continued)

FOREIGN PATENT DOCUMENTS

EP 1 085 578 3/2001

(Continued)

OTHER PUBLICATIONS

Proceedings of the IEEE, Proceedings Letters, Nov. 1968, pp. 2094-2095.

(Continued)

*Primary Examiner*—Hsien-ming Lee

(57) ABSTRACT

A method includes forming a fluid including an inorganic semiconductor material, depositing a layer of said fluid on a substrate to form a film, and curing said film to form a porous semiconductor film.

17 Claims, 5 Drawing Sheets

U.S. PATENT DOCUMENTS

2004/0154488 A1* 8/2004 Tomita et al. .............. 101/458
2005/0069718 A1* 3/2005 Voss-Kehl et al. .......... 428/447
2006/0267475 A1* 11/2006 Visser et al. ................ 313/495

FOREIGN PATENT DOCUMENTS

| EP | 1 357 566 | 10/2003 |
| JP | 2002-076356 | 3/2002 |
| JP | 2003-086808 | 3/2003 |
| JP | 2003-273119 | 9/2003 |

OTHER PUBLICATIONS

Extended abstracts of the 2000 International Conference on Solid State Devices and Materials; Aug. 29-31, 2000, Sendai Intl Center, pp. 128-129.
Ohtomo, "Novel Semiconductor Technologies of ZnO Films towards . . . ", IEICE Trans. Electron., vol. E83-C, No. 10, Oct. 2000, pp. 1614-1617.

* cited by examiner

METHOD TO FORM A FILM

BACKGROUND

Semi-conductor devices are employed in many electronic circuit applications, such as signal processing, computing, and wireless communications. As these applications expand, there is constantly a demand to reduce the cost of these transistors. Several challenges exist in meeting this demand. One such challenge is the time used to form the semi-conductor devices. Another challenge relates to obtaining a desired level of charge mobility within the semi-conductor device in an inexpensive manner.

BRIEF DESCRIPTION OF THE DRAWINGS

The accompanying drawings illustrate various embodiments of the present apparatus and method and are a part of the specification. The illustrated embodiments are merely examples of the present apparatus and method and do not limit the scope of the disclosure.

Throughout the drawings, identical reference numbers designate similar, but possibly not identical, elements.

DETAILED DESCRIPTION

Figure 1:
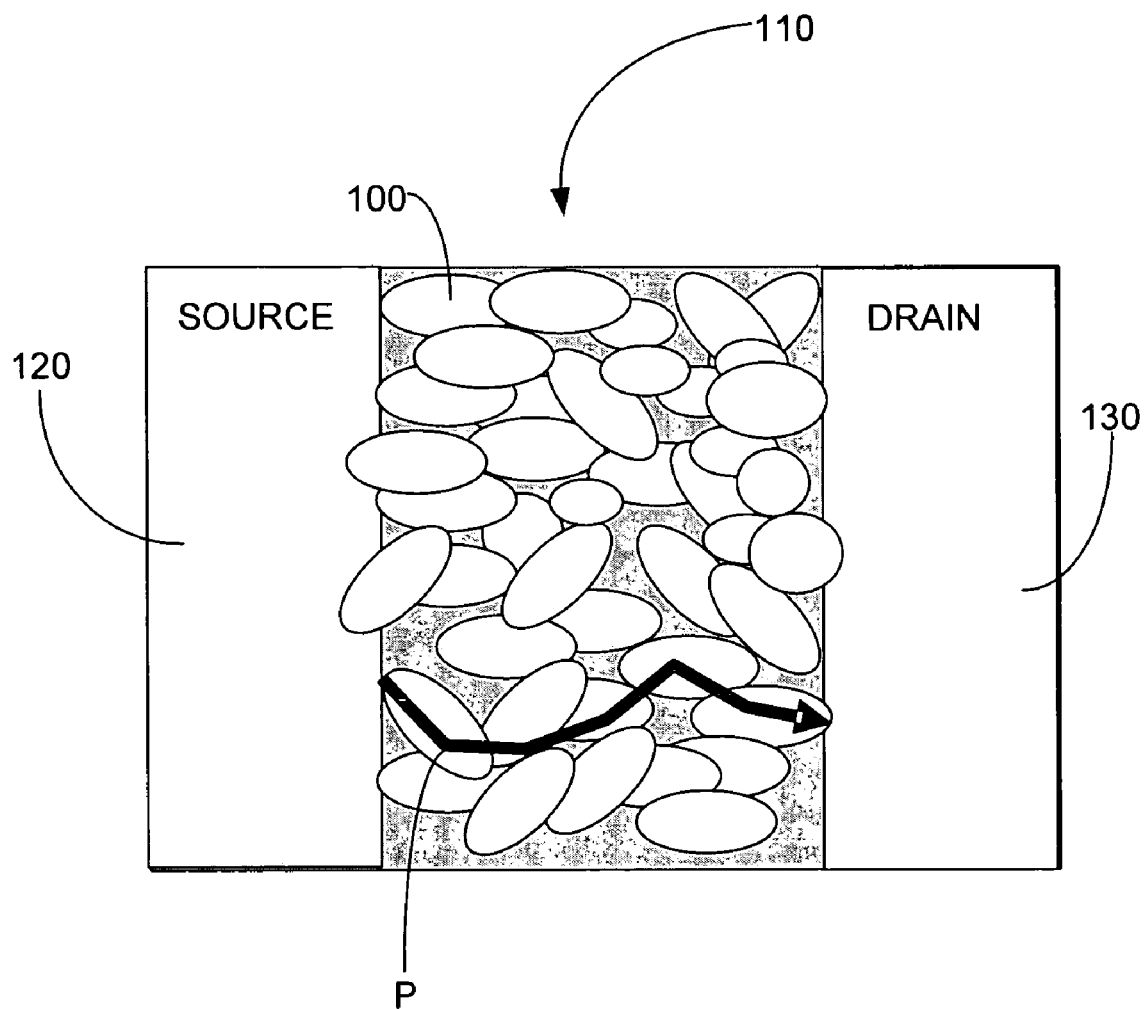
FIG. 1 illustrates an exemplary semiconductor film connecting two electrodes.

The present specification describes a method of forming an inorganic semiconductor film that includes forming a fluid including an inorganic semiconductor material, depositing a layer of the fluid on a substrate to form a film, and rapidly curing the film to form a porous semiconductor layer. By controlling the formulation of the fluid with additives, the cure rate of the layer and/or the porosity of the resulting layer may be controlled. Rapidly curing the film allows for a reduced cost of forming semiconductor devices that make use of the film.

The fluid may be deposited, for example, using fluid ejection or printing technology, such as inkjet technology. The present apparatus and method allow for low cost, 'direct write' fabrication of a transistor that is made of inorganic materials, such as oxides, including zinc oxide (ZnO). By using an appropriate fluid formulation, the present apparatus and method allow for increased ease of processing while also providing a desirable level performance and stability. This may be accomplished, for example, by additives used in the fluid formulation that provide for the processability of the fluid including deposition and curing and to achieve a desired level of performance for the resulting film.

Further, the present apparatus and method provide for the formation of low-density layers of semiconductor material. These low-density layers provide performance characteristics suitable for a number of electronic devices. In forming relatively less dense layers, the present apparatus and method allow for the use of rapid and relatively inexpensive application and curing techniques, which lowers the cost of forming semiconductor devices and the electronic devices that use them.

For example, as will be discussed in more detail below, these porous, low-density films may be formed by jetting or spin coating inorganic semiconductor materials suspended in a solution, such as by using the sol-gel process that is described below. The observation of field effect in these porous films extends the processing window of semiconductor films or layers to process and/or cost spaces which are relevant to low cost electronics.

The term "jettable material", as used herein, is meant to be understood as any material that has properties sufficient to allow the material to be selectively deposited by any inkjet or other material dispenser. Charge mobility shall be broadly understood to mean a proportionality factor between carrier drift velocity and electric field as well as carrier concentration and conductivity of semiconductor; expressed in units of $cm^2/V*s$.

In the following description, for purposes of explanation, numerous specific details are set forth in order to provide a thorough understanding of the present method and apparatus. However, the present method and apparatus may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification may not be referring to the same embodiment.

Figure 4:
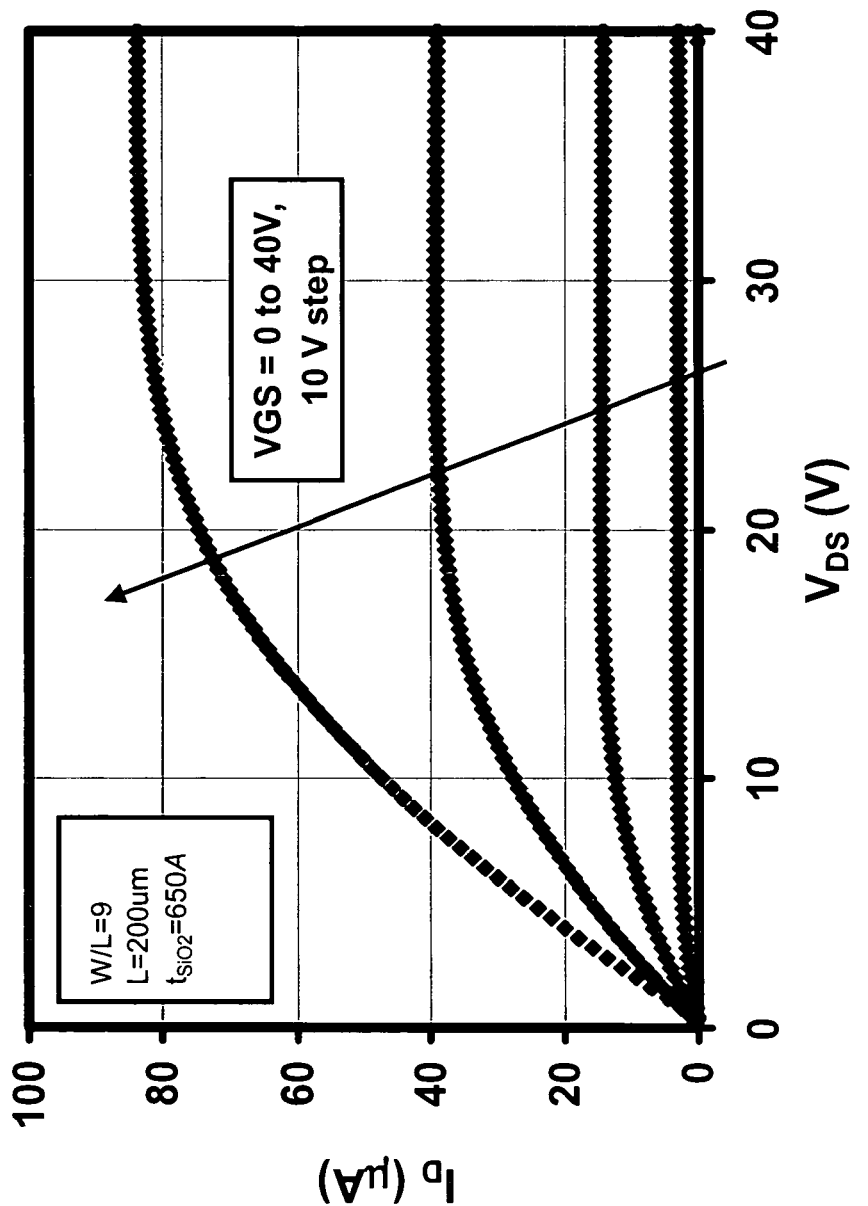
FIG. 4 is a graph showing performance characteristics of an exemplary semiconductor film.
Figure 5:
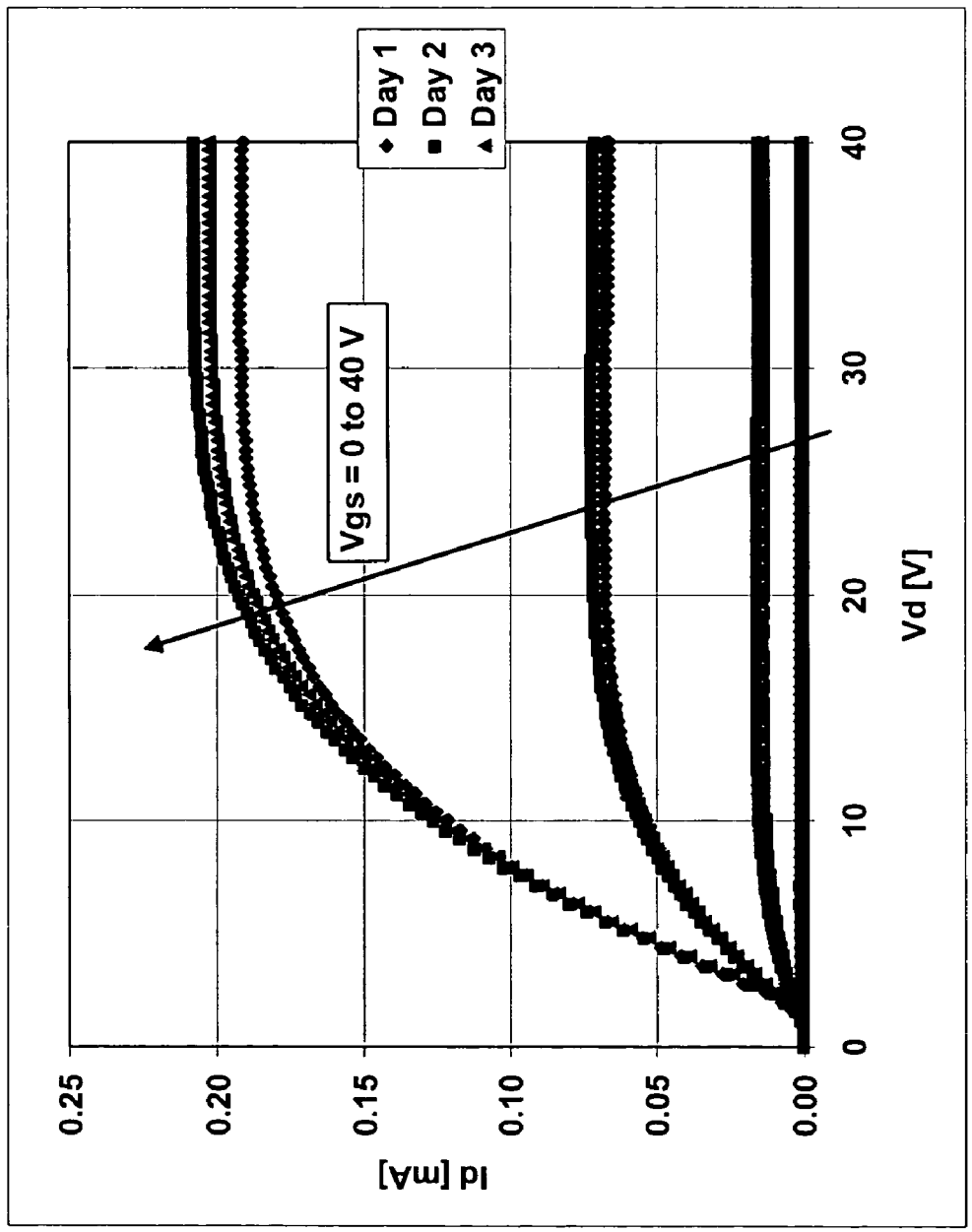
FIG. 5 is a graph showing performance characteristics of an exemplary semiconductor film.

A method of forming an inorganic semiconductor film includes forming a fluid including an inorganic semiconductor material, depositing a layer of the fluid on a substrate to form a wet film, and curing the wet film. Some exemplary applications of this apparatus and method will first be discussed. A discussion of an exemplary semiconductor film and its associated charge mobility will be discussed with reference to FIG. 1, an exemplary semiconductor device will be discussed with reference to FIG. 2, and a method of forming an exemplary semiconductor device will be introduced with reference to FIG. 3. FIGS. 4 and 5 are characteristic performance plots of exemplary films.

FIG. 1 is a schematic view of semiconductor particles (100) that form a channel (110) between a source (120) and a drain (130). More specifically, the channel (110) includes a film of semiconductor particles (100) that remain after a thin film has been deposited and processed as discussed below with reference to FIG. 3. The resulting film is a porous film of relatively low density. Despite the porosity of the resulting film, charge pathways cross the entire width of the channel (110) as illustrated by arrow (P). These pathways are established by the connections between semiconductor particles (100).

For example, the semiconductor particles (100) may be formed as part of the oxide network formation process inherent in the sol-gel process. As the film is cured, the remaining semiconductor particles (100) come into contact with one another. As a result, in the case of the sol-gel process, the domains of the semiconductor material are created in situ during curing of the sol-gel film. By controlling the formulation of the solution or fluid used to form these layers, the uniformity of the resulting layer and hence the performance characteristics of the layer may be controlled.

The size and shape of the particles may vary, for example, from spheres of about 50 nanometers to rods of about 5-10 nanometer in length. An exemplary semiconductor device that makes use of this film will be discussed next, followed by a discussion of an exemplary method of forming such a semiconductor device.

Figure 2:
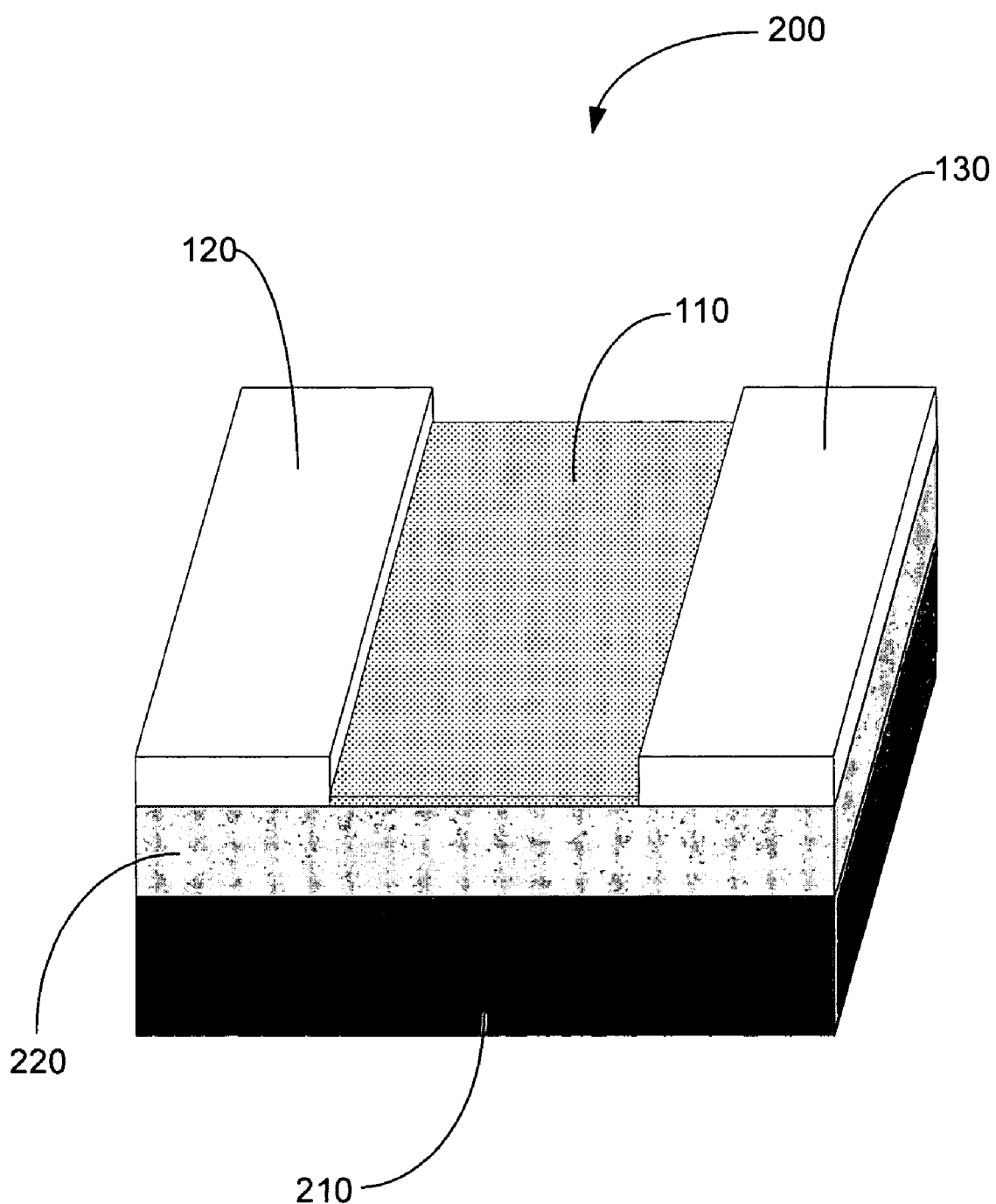
FIG. 2 illustrates an exemplary semiconductor device according to one exemplary embodiment.

FIG. 2 illustrates an exemplary semiconductor device, such as transistor (200). The transistor (200) shown is a back-gated, field effect, thin-film transistor though any type of transistor or other semiconductor device may be formed.

The transistor (200) includes a gate (210). The channel (110) extends between the source (120) and the drain (130). As previously discussed, the channel (110) shown is formed of a relatively thin and porous film of inorganic semiconductor material. The transistor (200) also includes a gate dielectric (220), which is a layer that separates the channel (110), the source (120) and the drain (130) from the gate (210).

The transistor (200) is activated by applying a voltage to the gate (210). When a voltage is applied to the gate (210), the gate dielectric (220) sustains an electric field that controls the current that flows between the source (120) and the drain (130) through the semiconductor path formed within the channel (110). The amount of current that flows between the source (120) and the drain (130) depends, at least in part, on the effective electrical thickness of the channel (110). As previously discussed the physical thickness of the channel (110) is fixed, but the effective electrical thickness of the channel (110) varies with the level the voltage applied to the gate (210). The larger the applied voltage, the more current flows across the channel (110). Consequently, a small change in voltage applied to the gate (210) can cause a large variation in the current between the source (120) and the drain (130).

If the channel (110) provides insufficient charge mobility, the amount of current flowing across the channel (110) in response to the application of the voltage to the gate (210) will be insufficient for proper operation of the transistor (200). More specifically, the voltage level applied to the gate (210) may frequently be characterized as an input signal. The transistor (200) amplifies the input signal by allowing a varying amount of current to flow across the channel (110) according to the amplitude of the input signal. If the transistor (200) has insufficient charge mobility, the amplification function of the transistor (200) is compromised because insufficient current is able to flow across the channel (110). Consequently, if the channel (110) has insufficient charge mobility, the transistor (200) does not function properly.

The channel (110), while formed of relatively less dense films of inorganic semiconductor material, provides sufficient charge mobility for many applications. As will be discussed in more detail below, the use of relatively less dense films allows for the formation of semiconductor devices using rapid and relatively inexpensive application and curing techniques, which lowers the cost of forming semiconductor devices and the electronic devices that use them. One exemplary method of forming a semiconductor device using such a film will now be discussed in more detail.

Figure 3:
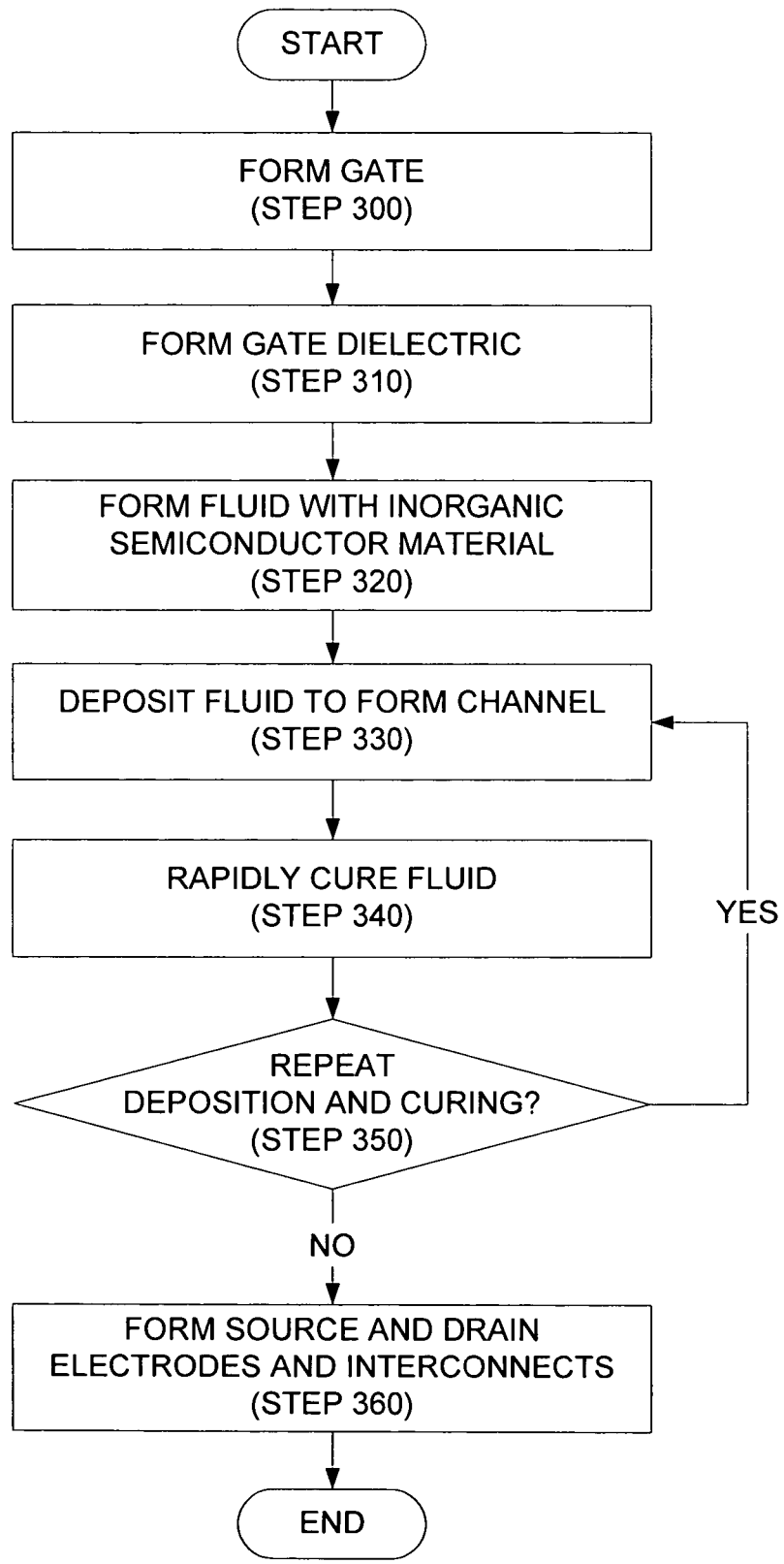
FIG. 3 is a flowchart illustrating a method of forming a semiconductor device according to one exemplary embodiment.

FIG. 3 is a high level flowchart illustrating a method of forming a semiconductor device on a substrate. While the exemplary method describes the formation of a field effect transistor, any semiconductor device with a suitable power handling capability may be formed according to the present method.

The method begins by forming a gate on the substrate (step 300). Examples of suitable substrates may include, for example, silicon, quartz, glass, or other thermally stable substrates, or plastics or other non-thermally stable substrates. The gate may be formed according to methods such as, for example, chemical vapor deposition (CVD), vacuum processes, screen printing, direct write, or lithography techniques. Once the gate is formed (step 300), the gate dielectric is then formed on the gate (step 310) in any suitable manner, including those discussed for formation of the gate.

Once the gate and gate dielectric have been formed (steps 300-310), the channel may be formed on the gate dielectric. This process will be described with reference to steps 320-340. The formation of the channel, including the precursor deposition and curing process will be discussed with reference to a sol-gel process. However, other liquid chemistries other than sol-gel may be used. In general any fluid medium containing metal cations of the desired final metal oxide film may be used. For example, dissolved metal acetate or metal nitrate, e.g. $M(C_sH_3O_2)_2$ or $M(NO_3)_2$ (where M is a metallic element) in a solvent such as water or ethanol. The sol-gel process will now be discussed in more detail, before returning to the method of forming the semiconductor device.

A sol-gel process is a solution process for processing ceramics, glass materials, and semiconductor materials, including inorganic semiconductor materials. In general, the sol-gel process involves the transition of a system from a liquid "sol" into a solid "gel" phase. Applying the sol-gel process, it is possible to fabricate nanoporous or microporous inorganic films of semiconductor materials.

The starting materials used in the preparation of the "sol" may be some form of metal alkoxides. The final resulting inorganic metal oxide films may include those used as semiconductors. As previously discussed, it may be desirable to use inorganic semiconductors, due to their relatively increased performance. Accordingly, reference to semiconductors used in a sol-gel process will be made with the use of an inorganic semiconductor material.

In a typical sol-gel process, the precursor is subjected to a series of hydrolysis and polymerization reactions to form a suspension, or a "sol". As a result of these reactions, metal oxide networks terminated with organic groups are formed in solution. When the "sol" is deposited on a substrate, a wet "gel" is formed. If the liquid in a wet "gel" is removed relatively quickly, a porous and low density material is obtained.

Returning to the method shown in FIG. 3, the application of the sol-gel process to the formation of the semiconductor portion of a semiconductor device is now discussed in more detail. The first step in forming the channel is to form the fluid with inorganic semiconductor material contained therein (step 320). The fluid may be a sol-gel, i.e. a precursor having metal alkoxides in solution which may be used to form metal oxides such as $ZnO$, $SnO_2$, and $In_2O_3$ or mixtures thereof.

Further, the fluid may be formulated using additives in order to achieve a desired level of processability of the fluid, such that the fluid may be deposited using inkjet or spin coating methods. The processability characteristics may include viscosity, surface tension and any other parameter that is adjusted as a function of the deposition technique. Examples of additives used to control these processability characteristics include, for example, alcohols such as ethanol, isopropyl alcohol, methanol, and 2-methoxyethanol; aromatics such as toluene; alkanes such as hexane and octane; and other functional groups such as esters, ethers, alkenes, alkynes, aldehydes, ketones and amides.

In addition, additives may be used to achieve a desired level of performance of the resulting film. These performance characteristics may include chemical reactivity, film homogeneity, uniformity, and/or density. Some examples of additives that may be used to achieve a desired level of performance include, but are not limited to organic acids such as 2ethyl-hexanoic acid and acetic acid; and bases including amines such as monoethanolamine and diethanolamine.

After forming the fluid (step 320), the next step is to deposit the fluid at the desired locations to form a channel (step 330).

The selective use of additives for improving processability allows the fluid to be formulated so that it may be applied quickly by relatively inexpensive machines. For example, additives may be included in the fluid such that the viscosity of the fluid may be between about 1-15 centipoise (cP) If the fluid is heated prior to deposition, the room-temperature viscosity of the fluid may be drastically reduced. For such a case, the ambient (i.e. room temperature) viscosity may be as high as 500 cP. Such a viscosity allows the fluid to be dispensed by an inkjet. Machines such as inkjet dispensers, including thermal inkjets, are able to deposit the precursor precisely to desired locations. This precision reduces the amount of semiconductor solution used to form the circuit. Further, the precise deposition of the precursor allows for the formation of relatively thin layers or films.

In addition to inkjetting techniques, spin coating techniques may also be used. For the case of spin coating, the material is applied everywhere on the substrate and other process steps (e.g. photolithography) are used to pattern the films. Spin coating allows the use of a relatively simple deposition mechanism such that the fluid used may be formulated to less strict specifications.

Once the fluid has been deposited, the fluid is cured (step 340). When these films are deposited, the film on the substrate will be wet. The liquid component of the film, which may also be referred to as "solvent," is removed by evaporation when the deposited wet film is heated. To varying degrees for different systems, the morphology of the resulting film can be controlled by the rate of evaporation of the solvent. For single solvent sol-gel systems which may have relatively high vapor pressures (i.e. low boiling points), rapid heating may cause excessive porosity due to the boiling or cavitation of the wet film.

These events may be controlled by including additives. One example of such an additive is a large molecular weight carboxylic acid, such as 2-ethylhexanoic acid, which has a boiling point of 228° C. Thus, when the sample is heated, the low boiling point solvent is first evaporated leaving behind a still viscous wet film. Upon further heating (with time and/or temperature), the higher boiling point additive is removed and/or decomposed. Since the formation of the final metal oxide film is made more gradual in this way, a more uniform film may be obtained. Other additives, such as the additives for controlling performance as previously discussed, may also be used to control boiling or cavitation of the wet film.

The heat used for removing the solvent and/or additives may be provided by a rapid thermal annealing procedure. For example, the wet film may be exposed directly to a hotplate with no intermediate bake. In one exemplary implementation, the wet film is directly exposed to a hotplate at about 400-550 degrees Celsius.

For the case of silicon substrates, samples can be placed directly on a hotplate at those temperatures such that the sample is heated about 3-5 seconds. As a result, the heating rate of the sample may be as high as between 100-170 degrees Celcius per second (C/s). It may be desirable to control the rate of heating such that the heating rate is between about 25-50 C/s.

These heating rates may be used as necessary to heat the sample to temperatures between about 200 degrees Celcius to about 550 degrees Celcius, depending on the precursor.

Other suitable curing methods include rapid thermal processing (RTP), laser heating, infrared light heating, or other forms of heating may be used to cure the wet film. The use of local heating, such as that provided through the use of lasers to cure the wet film, may allow for the use of a broader range of substrate materials. For example, plastic substrates may be used, provided the heat can be applied without raising the substrate above an acceptable temperature level.

The resulting layer is a porous layer of inorganic semiconductor material such that the porous layer is about 20-90% of bulk density. These films have a density that is substantially less than a bulk quantity while achieving modest mobility performance. For example, the resulting films may have a mobility value of up to about 4 $cm^2/Vs$. While bulk mobility rates may be as high as about 20 $cm^2/Vs$, mobility in the range of about 1 $cm^2/Vs$ may be sufficient for certain devices, such as displays.

Once a layer has been formed and cured, it may be desirable to form additional layers of semiconductor material. If it is determined that an additional layer of semiconductor should be formed (YES, determination 350), the deposition and curing of the sol-gel is repeated. If is determined that no further layers of semiconductor material are desired (NO, determination 350), the rest of the components of the semiconductor device, are formed (step 360). These components may include the source and drain electrodes (120, 130; FIG. 1), interconnects, etc and may be formed by a variety of methods.

The method discussed described the formation of a back-gated, thin-film transistor. The present method may be used to form semiconductors of other configurations and types. Furthermore, the steps above may be varied in order while achieving the same results. Accordingly, the present method provides for formation of a fluid with a desired level of processability and the deposition and curing of a film that can be tuned to provide for rapid and inexpensive formation of semiconductor devices. A few examples of these films and their performance characteristics will now be discussed in more detail.

FIG. 4 shows the output characteristics of a film processed without a significant amount of additives for controlling performance. The graph plots drain current ($I_D$) against drain voltage ($V_{DS}$) for four corresponding gate voltages ($V_{GS}$). The first gate voltage corresponds to a gate voltage of 10V, the second to 20V, the third to 30V, and the fourth to 40V. The results shown are calculated using the output characteristics. As shown in the graph, the calculated effective mobility of the device is 0.74 $cm^2/V*s$ at $V_{GS}$=40V. This effective mobility is sufficient for devices having relatively modest power and desired switching performance, such as low cost electronic devices.

FIG. 5 shows the characteristic performance of a relatively low-density, porous semiconductor film formed by thermal inkjetting in which the sol-gel was formulated using isopropanol/2ethylhexanoic acid (90/10 volume ratio). The film whose characteristic performance is shown in FIG. 5 was processed under substantially similar conditions as the film described with reference to FIG. 4. However, the uniformity of the resulting film has been enhanced. The improved uniformity of the film may be due to the addition of the high boiling-point co-solvent, which reduces cavitation during curing. As a result, the addition of the high boiling-point solvent allows the formation of more uniform yet porous films that are semiconductive and for the rapid thermal treatment of the films.

As seen in FIG. 5, the addition of a high boiling point solvent increases the calculated effective mobility of the device to 2.0 $cm^2/Vs$ at $V_{GS}$=40V. As a result, the addition of a high boiling point solvent may provide higher effective mobility for the device, thereby increasing the applicability of the method and apparatus to devices having relatively higher switching and desired power handling capability. Consequently, the uniformity of a resulting film can be 'tuned' according to the desired performance of the device with co-solvents.

In conclusion, the present apparatus and method allows for low cost, 'direct write' fabrication of a transistor that is made of inorganic materials. By using proper fluid formulation, the present apparatus and method allows for increased ease of processing (i.e. solution processing, e.g. via inkjet) while providing for the high performance and stability of inorganic semiconductor materials. For example, additives may be used in the fluid formulation to achieve a desired level of processability of the fluid including deposition and curing and to achieve a desired level of performance of the resulting film.

The preceding description has been presented only to illustrate and describe the present method and apparatus. It is not intended to be exhaustive or to limit the disclosure to any precise form disclosed. Many modifications and variations are possible in light of the above teaching. It is intended that the scope of the invention be defined by the following claims.

What is claimed is:

1. A method, comprising:
   forming a fluid including an inorganic semiconductor material and an additive;
   depositing a layer of said fluid on a substrate to form a film; and
   curing said film to form a porous semiconductor film;
   in which said additive affects a cure rate of said film to increase uniformity of the film when cured;
   said depositing said layer of said fluid comprises jetting said fluid; and
   said jetting is performed with an inkjet device.

2. A method, comprising:
   forming a fluid including an inorganic semiconductor material and an additive;
   depositing a layer of said fluid on a substrate to form a film;
   curing said film to form a porous semiconductor film, in which said additive affects a cure rate of said film to increase uniformity of the film when cured;
   forming a gate layer of a transistor on said substrate;
   then, depositing said layer of said fluid on said substrate; and
   forming a channel of said transistor from said porous semiconductor film after said curing.

3. A method, comprising:
   forming a fluid including an inorganic semiconductor material and an additive;
   depositing a layer of said fluid on a substrate to form a film; and
   curing said film to form a porous semiconductor film;
   in which said additive affects a cure rate of said film to increase uniformity of the film when cured; and
   said inorganic semiconductor material comprises a metal alkoxide.

4. A method, comprising:
   forming a fluid including an inorganic semiconductor material and an additive;
   depositing a layer of said fluid on a substrate to form a film; and
   curing said film to form a porous semiconductor film;
   in which said additive affects a cure rate of said film to increase uniformity of the film when cured; and
   said additive increases a viscosity of said fluid.

5. The method of claim 4, wherein said increased viscosity is between 1-15 centipoise.

6. A method, comprising:
   forming a fluid including an inorganic semiconductor material and an additive;
   depositing a layer of said fluid on a substrate to form a film;
   curing said film to form a porous semiconductor film, in which said additive affects a cure rate of said film to increase uniformity of the film when cured; and
   heating said fluid prior to said deposition to increase a viscosity of said fluid.

7. The method of claim 6, wherein sad viscosity of said fluid after said heating is between 1-500 centipoise.

8. A method, comprising:
   forming a fluid including an inorganic semiconductor material and an additive;
   depositing a layer of said fluid on a substrate to form a film; and
   curing said film to form a porous semiconductor film;
   in which said additive affects a cure rate of said film to increase uniformity of the film when cured; and
   forming said fluid comprises placing said inorganic semiconductor material in a first solvent, where said additive comprises a second solvent having a lower boiling point than said first solvent.

9. The method of claim 8, wherein said curing further comprises heating said layer above said lower boiling point of said second solvent to evaporate said second solvent, leaving a still viscous wet film comprising said first solvent.

10. The method of claim 9, further comprising removing or decomposing said first solvent to complete said curing.

11. A method, comprising:
    forming a fluid including an inorganic semiconductor material and an additive;
    depositing a layer of said fluid on a substrate to form a film; and
    curing said film to form a porous semiconductor film;
    in which said additive affects a cure rate of said film to increase uniformity of the film when cured; and
    wherein said curing comprises applying heat locally to selected portions of said film.

12. The method of claim 11, wherein said curing comprises annealing said film with a laser.

13. The method of claim 11, wherein said substrate is made of plastic.

14. A method, comprising:
    forming a fluid including an inorganic semiconductor material and an additive;
    depositing a layer of said fluid on a substrate to form a film; and
    curing said film to form a porous semiconductor film;
    in which said additive affects a cure rate of said film to increase uniformity of the film when cured; and
    wherein said additive comprises hexane or octane.

15. A method, comprising:
    forming a fluid including an inorganic semiconductor material and an additive;
    depositing a layer of said fluid on a substrate to form a film; and
    curing said film to form a porous semiconductor film;
    in which said additive affects a cure rate of said film to increase uniformity of the film when cured; and
    said additive comprises 2-ethylhexanoic acid or acetic acid.

16. A method, comprising:
    forming a fluid including a first solvent, an inorganic semiconductor material, and an additive comprising a second solvent, wherein said second solvent has a lower boiling point than said first solvent;

depositing a layer of said fluid on a substrate to form a film; and curing said film to form a porous semiconductor film by heating said film above said lower boiling point to remove said second solvent while leaving said first solvent and, after removing said second solvent, removing or decomposing said first solvent to produce said porous semiconductor film.

17. The method of claim 16, further comprising heating said fluid prior to said depositing a layer of said fluid.

* * * * *

UNITED STATES PATENT AND TRADEMARK OFFICE
CERTIFICATE OF CORRECTION

PATENT NO. : 7,575,979 B2  Page 1 of 1
APPLICATION NO. : 10/875034
DATED : August 18, 2009
INVENTOR(S) : David Punsalan et al.

It is certified that error appears in the above-identified patent and that said Letters Patent is hereby corrected as shown below:

In column 8, line 51, in Claim 14, before "said" delete "wherein".

Signed and Sealed this

Twentieth Day of July, 2010

David J. Kappos
*Director of the United States Patent and Trademark Office*